(12) United States Patent
Cho

(10) Patent No.: US 11,890,963 B2
(45) Date of Patent: Feb. 6, 2024

(54) METHOD AND SYSTEM FOR METHOD FOR ESTIMATING A PRESENT ENERGY CONSUMPTION OF AN ELECTRICALLY PROPELLED VEHICLE

(71) Applicant: VOLVO TRUCK CORPORATION, Gothenburg (SE)

(72) Inventor: Il Cho, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 17/651,640

(22) Filed: Feb. 18, 2022

(65) Prior Publication Data

US 2022/0297569 A1  Sep. 22, 2022

(30) Foreign Application Priority Data

Mar. 16, 2021  (EP) ..................................... 21163014

(51) Int. Cl.
*B60L 58/12* (2019.01)

(52) U.S. Cl.
CPC ................................... *B60L 58/12* (2019.02)

(58) Field of Classification Search
CPC ........ B60L 58/12; B60L 2200/36; B60L 3/12; B60L 2260/42; B60L 2260/48; B60L 2260/52; B60L 2260/54; B60L 58/10; B60L 2240/54; B60L 2260/44; H02J 3/003; H02J 7/0048; H02J 2310/48; G01R 31/382
See application file for complete search history.

(56) References Cited

U.S. PATENT DOCUMENTS

| | | | | |
|---|---|---|---|---|
| 8,080,971 B2 * | 12/2011 | Bose | ....................... | B60L 53/11 |
| | | | | 429/408 |
| 8,138,720 B2 * | 3/2012 | Snyder | .................... | B60L 58/20 |
| | | | | 307/53 |
| 2009/0212626 A1 * | 8/2009 | Snyder | .................. | B60L 15/209 |
| | | | | 903/930 |
| 2013/0041538 A1 | 2/2013 | Jin et al. | | |
| 2013/0096745 A1 * | 4/2013 | Hussain | ................ | B60W 20/12 |
| | | | | 180/65.265 |

(Continued)

FOREIGN PATENT DOCUMENTS

| | | | | |
|---|---|---|---|---|
| GB | 2515582 | * | 12/2014 | .............. B60L 11/18 |
| GB | 2515582 A | | 12/2014 | |
| WO | 2020169944 A1 | | 8/2020 | |

OTHER PUBLICATIONS

European Search Report dated Aug. 23, 2021 in corresponding European Patent Application No. 21163014.0, 8 pages.

*Primary Examiner* — Tung S Lau
(74) *Attorney, Agent, or Firm* — Venable LLP; Jeffri A. Kaminski

(57) ABSTRACT

A method for estimating a present energy consumption of an electrically propelled vehicle powered by a propulsion battery. The method includes obtaining previous energy consumption values for a set of previous time instants, and a present drive pattern parameter value; estimating a present energy consumption based on a weighted moving average model fed with the energy consumption values, wherein, the weighted moving average model includes a modelled gain factor for each of at least a portion of the previous energy consumption values, where the modelled gain factors are modelled as a function of the drive pattern parameter.

13 Claims, 3 Drawing Sheets

(56) References Cited

U.S. PATENT DOCUMENTS

| | | |
|---|---|---|
| 2013/0311016 A1 | 11/2013 | Kim |
| 2014/0074329 A1 | 3/2014 | Yang et al. |
| 2018/0164121 A1 | 6/2018 | Ichikawa |
| 2020/0309857 A1 | 10/2020 | Zeyghami et al. |

* cited by examiner

METHOD AND SYSTEM FOR METHOD FOR ESTIMATING A PRESENT ENERGY CONSUMPTION OF AN ELECTRICALLY PROPELLED VEHICLE

TECHNICAL FIELD

The present disclosure relates to a method for estimating a present energy consumption of an electrically propelled vehicle powered by a propulsion battery. The present disclosure also relates to a corresponding system. Although the method and system will be described in relation to a vehicles in the form of a truck, the method and system can also be efficiently incorporated in other vehicles types such as busses, as long as they are at least partly electrically propelled.

BACKGROUND

Batteries are becoming a more common source of power for providing propulsion power to vehicles. Such batteries are most often rechargeable batteries and consist of several battery cells that may be connected in series and/or in parallel forming a complete battery pack for the vehicle.

In energy management of electric vehicles, the available energy in the battery is typically monitored. The available energy can be used for estimating the available driving range, or so-called distance-to-empty which important for electric vehicles because charging stations are often sparsely located throughout some areas. Further, since charging time is often longer than for combustion vehicles, it is advantageous to be able to plan charging occasions to avoid long charging times.

In order to estimate the distance-to-empty, it is important to accurately estimate the present energy consumption. For example, long term energy efficiency may be calculated overtime, or a pre-defined energy efficiency may be used to estimate distance-to-empty.

However, there is room for improvement with regards to accurately estimating the present energy consumption and therefore also the accuracy of the distance-to-empty estimations which is often a concern to drivers of electric vehicles.

SUMMARY

An object of the invention is to provide an improved method to estimate a present energy consumption of an electrically propelled vehicle powered by a propulsion battery.

According to a first aspect of the invention, the object is achieved by a method according to claim 1.

According to the first aspect of the invention, there is provided a method for estimating a present energy consumption of an electrically propelled vehicle powered by a propulsion battery, the method comprising: obtaining previous energy consumption values for a set of previous time instants, and a present drive pattern parameter value; estimating a present energy consumption based on a weighted moving average model fed with the energy consumption values, wherein, the weighted moving average model includes a modelled gain factor for each of at least a portion of the previous energy consumption values, where the modelled gain factors are modelled as a function of the drive pattern parameter.

By the provision of a method which comprises the use of a model based on a weighted moving average model, more unknown- or difficult to predict factors can be taken into account in the estimation. For example, factors that affect the energy consumption but that are difficult to predict may be air resistance, driver behaviour, road condition, weather condition, tire pressure, load weight, etc. A moving average as presented herein advantageously accounts for known and such unknown factors that may affect the estimated value, i.e. the present energy consumption. A short-term indication of the energy consumption is provided by a moving average, even if the factors of the driving conditions that affect the energy consumption are unknown. In addition, as was realized in accordance with the inventive concept, the use of modelled gain factors being a function of a drive pattern parameter provides a more accurate weighted moving average model that can further account for such factors even without physical models to describe such external factors.

The drive pattern parameter is a parameter that reflect a driving behaviour that directly or indirectly is indicative of, or affects, energy consumption. Example drive pattern parameters are, battery terminal voltage, battery state of charge, battery current, battery temperature, vehicle speed, travelled distance from start, time from start of drive session etc. The gain factors are modelled as a function of a drive pattern parameter, whereby the gain factors for prior energy consumption values are adapted to provide a reflection of past behaviour for which a large amount of different factors that affect the energy consumption is accounted for.

The energy consumption values are generally the energy consumed per unit distance, for example in terms of kWh/km. However, other expressions are also conceivable as long as it reflects energy consumed per unit distance.

Each of the previous energy consumption values correspond to a respective one of the previous time instants. In other words, the previous energy consumption values are past energy consumption values for a set of past time instants.

State of charge is the present level of charge in the energy storage device compared to its full capacity and may be given as a percentage value.

The propulsion battery should be interpreted as providing propulsion energy to the vehicle. Thus, vehicle may be an electrical, hybrid, or plug-in hybrid vehicle comprising an electrical engine, wherein the battery provides power to the electrical engine for providing propulsion for the electrical, hybrid, or plug-in hybrid vehicle.

A moving average generally relates to an average of a certain number of previous time instants, where, as time goes by, the window over which the average is calculated, moves with time. For example, if the moving average is for a set of data belonging to three previous time units, as time passes, the set of data is shifted forward correspondingly.

According to an example embodiment, the gain factors may be modelled as non-linear functions of a battery parameter. By including higher order terms in the model of the gain factors a more accurate moving average model is provided. The drive pattern parameter may thus be a battery parameter. The gain factors may thus be given by a non-linear function of the battery parameter.

For example, the battery parameter may be terminal voltage, current, temperature, or, preferably state of charge. The gain factors may be modelled as a polynomial function of the battery parameter. Hereby, an accurate and relatively simple model of the gain factors is provided that require reduced computational power.

The gain factors are calculated each time the weighted moving average model estimates a present energy consumption. For this, the present drive pattern parameter is inserted in the functions for the gain factors so that a present set of gain factors are calculated. The present set of gain factors are used in the weighted moving average model for estimating a present energy consumption. Thus, the gain factors vary as the drive parameter is altered. Further, the gain factors are each related to a respective one of the previous or past times instants.

According to an example embodiment, the method may comprise obtaining a present battery parameter value, wherein estimating the present energy consumption is based on the weighted moving average model fed with the energy consumption values and the battery parameter value, wherein the moving average model includes a modelled gain factor for the battery parameter value. By adding a further parameter, here a battery parameter, and a corresponding gain factor to the weighted moving average, the model may better handle offset situations. For example, if a previous energy consumption value relates to situations where the vehicle accelerated strongly and another previous energy consumption value relate to strong deceleration, the battery parameter and its gain factor serve to smooth such offsets. The battery parameter may be state of charge of the battery.

According to an example embodiment, the weighted moving average model may be a linear time invariant model. This is advantageously provided by means of the gain factors provides for a moving average model that has no time dependence and therefore requires reduced computational power for execution. Thereby, an embedded electronic control unit with limited computational power in the electric vehicle may be used for executing the method.

According to an example embodiment, the modelled gain factors are modelled using function approximators based on machine learning algorithms. Using machine learning algorithms may advantageously determine accurate gain factors based on the prior driving patterns. Example machine learning algorithms include neural networks, Nelder Mead methods, markov chains, nerofuzzy, genetic algorithms etc. which are known system identification algorithms for non-linear systems.

According to an example embodiment, the modelled gain factors may be predetermined offline using machine learning algorithms and are embedded in the weighted moving average model loaded in an embedded system on the vehicle and operative during operation of the vehicle. In this way, by having the gain factors predetermined, may the embedded system efficiently execute the method.

The gain factors may for example be determined from driving patterns that include drive pattern data for a set of driving sessions. Some driving pattern data may also be determined from experimental testing. The prior driving patterns may include data sets for different cases, such as data sets for high speed cases, average speed cases, low speed cases, and for different types of vehicle such as refuse truck usage, haul truck usage, fire truck, etc. Example drive pattern data are, battery terminal voltage, battery state of charge, battery current, battery temperature, vehicle speed, travelled distance from start, time from start of drive session etc. The gain factors may thus be modelled based on prior driving patterns.

According to an example embodiment, the method may comprises determining a remaining travel distance based on the predicted present energy consumption and the state of charge of the battery. Hereby, a remaining travel distance with improved accuracy is determined.

According to an example embodiment, wherein the gain factors may be modelled based on prior driving pattern data comprising a set of state of charge values and a set of values of at least one further battery parameter, for a plurality of propulsion batteries obtained from actual driving pattern tests. The at least one other parameter may be one or more of time (sec), terminal voltage (V), current (A), temperature (degC), Vehicle speed (km/h), travelled distance (km). The data of the prior driving patterns are measured with high accuracy sensors and devices and are used as reference data for modelling of the gain factors.

According to an example embodiment, the number of previous time instants is selected from the range of one second back to 100 seconds back. Preferably, about 2, 3, 4, 5 seconds back are used which provides for a short-term indication of the present energy consumption that does not lead to over-estimating the output by taking into account events that occurred too far in the past.

According to a second aspect of the invention, there is provided a system for estimating a present energy consumption of an electrically propelled vehicle powered by a propulsion battery, the system comprising: means for obtaining a driving pattern parameter value; a memory storage device for storing a representation of a weighted moving average model adapted to estimate the present energy consumption based on previous energy consumption values, the weighted moving average model includes a modelled gain factor for at least a portion of the previous energy consumption values, where the modelled gain factors are modelled as a function of the drive pattern parameter, and processing circuitry for retrieving and executing the weighted moving average model to estimate the present energy consumption.

According to example embodiments, the modelled gain factors are predetermined offline using machine learning algorithms and are loaded on the memory storage device prior to operation of the vehicle.

Effects and features of the second aspect of the invention are largely analogous to those described above in connection with the first aspect.

According to a third aspect of the invention, there is provided a vehicle comprising the system according to the second aspect.

According to a fourth aspect of the invention, there is provided a computer program comprising program code means for performing the steps the first aspect when the program is run on a computer.

According to a fifth aspect of the invention, there is provided a computer readable medium carrying a computer program comprising program code means for performing the steps of the first aspect when the program product is run on a computer.

According to a sixth aspect of the invention, there is provided a control unit for estimating a present energy consumption of an electrically propelled vehicle powered by a propulsion battery the control unit being configured to perform the steps of the method according to the first aspect.

Effects and features of the third, fourth, fifth, and sixth aspects are largely analogous to those described above in relation to the first aspect.

Further features of, and advantages will become apparent when studying the appended claims and the following description. The skilled person will realize that different features may be combined to create embodiments other than those described in the following, without departing from the scope of the present disclosure.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
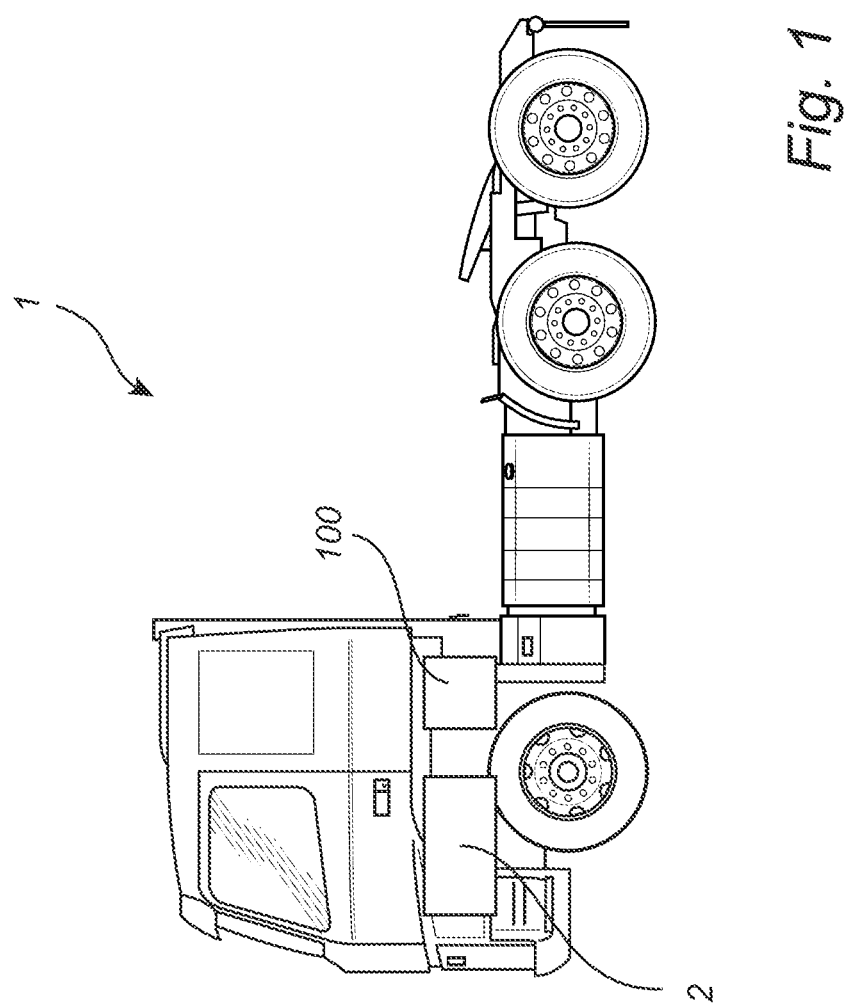
FIG. 1 is a vehicle in the form an electrical truck according to example embodiments of the invention.

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims.

Like reference character refer to like elements throughout the description.

FIG. 1 illustrates a vehicle in the form of an electrical truck 1 comprising an electrical energy storage module in the form of a propulsion battery 2 generally comprising a plurality of series and parallel connected battery cells. The propulsion battery 2 is arranged to provide power to an electrical engine (not shown) arranged for providing propulsion for the electrical truck 1. The electrical truck 1 further comprises an battery managing system 100 which is configured to monitor battery cell characteristics such as state of charge, battery voltage, and optionally temperature of the battery cells, and to estimate a present energy consumption of the electrically propelled vehicle 1 powered by the propulsion battery 2.

Figure 2:
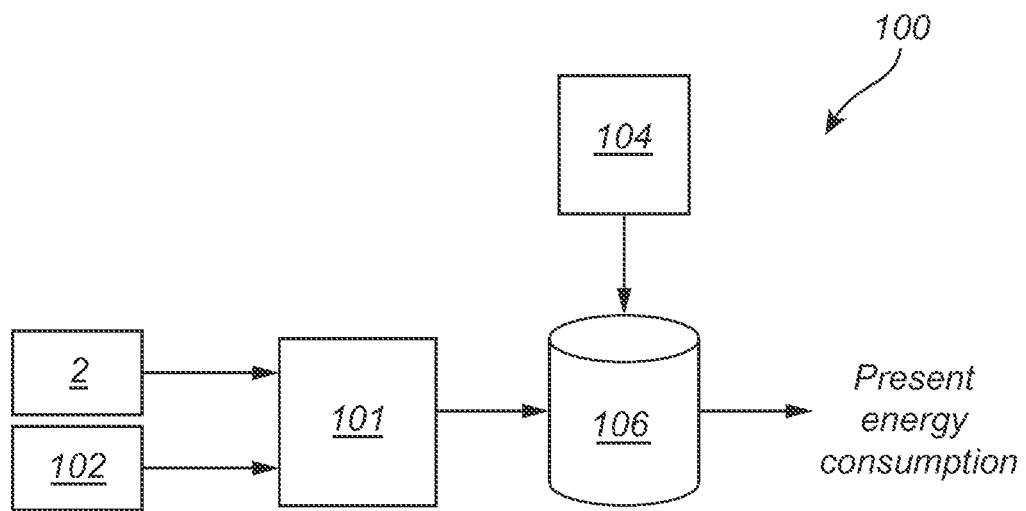
FIG. 2 is a block diagram of a system according to example embodiments of the invention.

FIG. 2 is a block diagram of a system 100 for estimating a present energy consumption of an electrically propelled vehicle powered by the propulsion battery 2. The system 100 comprising means 101 for obtaining a drive patter parameter value. Such means may be for example a data acquisition unit 101 or a further control unit 101 configured to acquire data from sensors adapted to measure characteristics of the battery 2 for determining the state of charge, and driving data parameters such as distance travelled from driving performance sensors 102. For example, for each kWh extracted from the battery, the associated distance travelled may be measured as a drive parameter value. As a further example, state of charge, at a given time, is estimated using measured current, voltage and temperature of the battery 2 and is fed to the control unit 106 for use a drive parameter value for calculating the gain factors each time a new moving average is calculated.

It should be understood that a distributed set of control units, e.g. electronic control units (ECUs) may equally well be used. For example, the means 101 may comprise ECUs connected to sensors that at a given time acquire data such as kWh and distance travelled. State of charge may be calculated using another control unit, e.g. a battery controller, and control unit 106 may be configured to execute the moving average model. Thus, the inventive concept may be implemented using one control unit or several control units with assigned functions.

Further, a memory storage device 104 is included for storing a representation of a weighted moving average model adapted to estimate the present energy consumption based on the previous energy consumption values. The weighted moving average model includes a modelled gain factor for at least a portion of the previous energy consumption values, where the modelled gain factors are modelled as a function of the drive pattern parameter, as will be discussed in more detail below.

Additionally, processing circuitry such as a control unit 106 is included and configured for retrieving and executing the weighted moving average model to estimate the present energy consumption. The control unit 106 is connected to the data acquisition unit 101 to obtain data of the driving pattern parameter such that the control unit 106 can process the data in the weighted moving average model retrieved from the memory storage device 104.

The control unit 106 is either hardwired or wirelessly connected to the memory storage device 104 and the data acquisition unit 101.

Once the present energy consumption has been calculated, the control unit 106 may calculate a remaining travel distance based on the predicted present energy consumption and the present state of charge of the battery 2.

Figure 3:
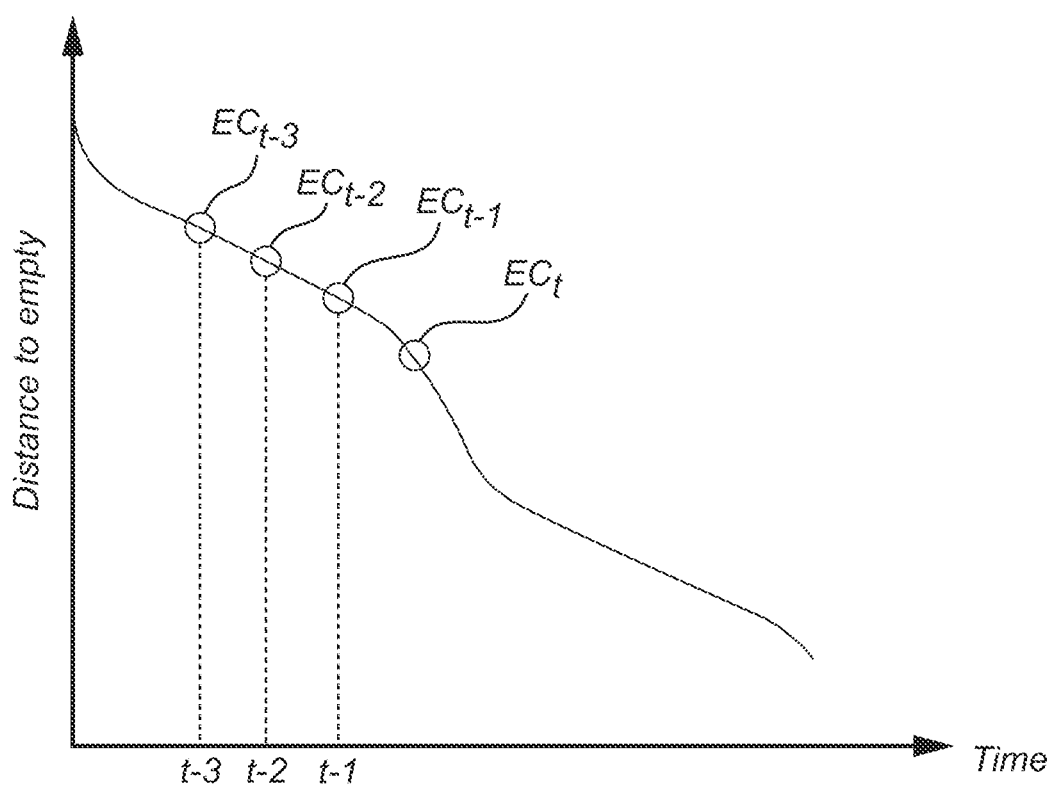
FIG. 3 is a graph illustrating remaining travel distance versus time.

FIG. 3 is a graph illustrating remaining travel distance, so-called distance-to-empty, versus time. Each time instant has a respective energy consumption value from which a remaining travel distance may be calculated. The energy consumption Ect at the present time instant is calculated as a weighted moving average of the previous energy consumption values ECt-1, ECt-2, and ECt-3. The previous energy consumption values are values that have been estimate using the weighted moving average model in prior time steps.

The weighted moving average model includes a modelled gain factor for at least a portion of the previous energy consumption values ECt-1, ECt-2, and ECt-3, preferably for each of the previous energy consumption values ECt-1, ECt-2, and ECt-3. The modelled gain factors are modelled as a function of a drive parameter. At each new time instant are the gain factors calculated based on the present drive parameter value, preferably being a battery parameter such as the present state of charge. This will be described in more detailed with reference to FIG. 4. Again, the previous energy consumption values, here ECt-1, ECt-2, and ECt-3 are each an outcome of the weighted moving average model. When the model is first initiated, either raw calculated energy consumption values or previous values stored in memory in past driving session may be used as start values.

Figure 4:
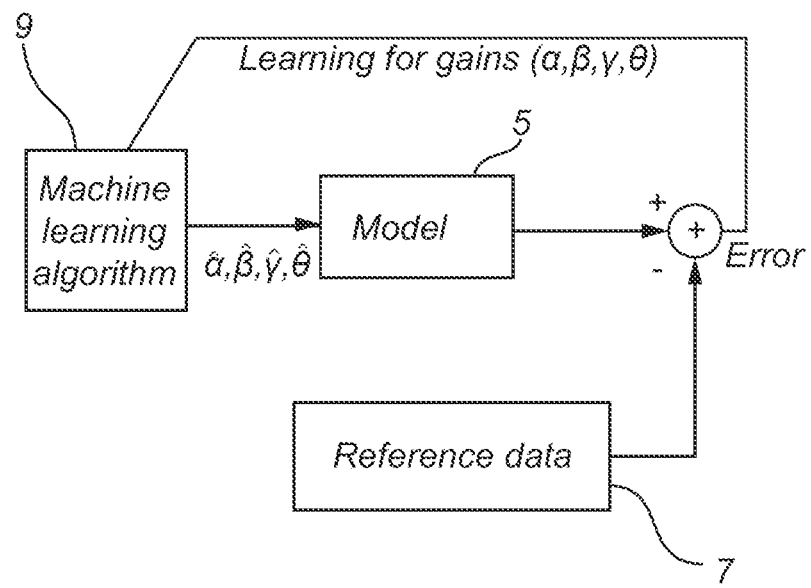
FIG. 4 is a block-diagram schematically illustrating the process of modelling the gain factors example embodiments of the invention.

FIG. 4 is a block-diagram schematically illustrating the process of modelling the gain factors. The gain factors are modelled using on machine learning algorithms, preferably so-called function approximators such as genetic algorithms. The block diagram thus includes a machine learning algorithm module 9.

The weighted moving average model is preferably a linear time invariant model. For example, the weighted moving average model of the model module 5 may be given by:

$$EC_t = \frac{\alpha * EC_{t-3} + \beta * EC_{t-2} + \gamma * EC_{t-1} - \theta * SoC}{\alpha + \beta + \gamma + \theta}$$

Where ECt is the present energy consumption, and ECt-1, ECt-2, and ECt-3 are previous energy consumption values at the time instances t-1, t-2, and t-3, and, $\alpha$, $\beta$, $\gamma$, and $\theta$ are the gain factors. The previous energy consumption values are prior outputs of model 5, i.e. at prior time steps t-1, t-2, and t-3. Here the weighted moving average also includes present state of charge and a respective gain factor θ.

The gain factors are modelled by the function approximator 9 as a function of a drive pattern parameter, for example state of charge (SoC), i.e. for α:

$$\alpha = A*SoC^2 + B*SoC + C$$

Here being a non-linear function of state of charge. Although α is here a second order function of state of charge, higher orders such as third, fourth, fifth, etc are also conceivable. Analogous functions are provided for the other gain factors, e.g. β, γ, and θ. In other words, each of the gain factors may modelled as anon-linear function of a drive pattern parameter, for example state of charge (SoC).

Data from actual driving patterns are prior input to and stored in a reference data module 7. This data includes driving pattern data for a set of driving sessions performed in actual driving situations. Some driving pattern data may also be determined from experimental testing. The prior driving patterns may include data sets for different cases, such as data sets for high speed cases, average speed cases, low speed cases, and for different types of vehicle such as refuse truck usage, haul truck usage, fire truck, etc. Example drive pattern data are, battery terminal voltage, battery state of charge, battery current, battery temperature, vehicle speed, travelled distance from start, time from start of drive session etc.

An output from the machine learning algorithm 9 includes modelled gain factors that are input to the weighted moving average model 5. Thus, in a present iteration of the process, the present estimated gains factors $\hat{\alpha}$, $\hat{\beta}$, $\hat{\gamma}$, and $\hat{\theta}$ from the machine learning algorithm are used in the model 5. From the reference data is an actual energy consumption value calculated and is compared to the output of the moving average model 5. The error therebetween is obtained and used for the machine learning algorithm to provide an improved estimate of the modelled, α, β, γ, and θ in the next iteration, whereby the next iteration gain factors output from the machine learning algorithm are again input in the moving average model 5. This process is repeated until a satisfactory error margin is obtained. The final modelled gain factors, α, β, γ, and θ are used in the weighted moving average model finally loaded on the memory storage device 104 of the vehicle 1.

Advantageously, the modelled gain factors are predetermined offline using machine learning algorithms 9 and are embedded in the weighted moving average model loaded on the vehicle 1 in an embedded system comprising the control unit 106 and memory 104. The embedded system may be operative using the weighted moving average model during operation of the vehicle. In this way, the computational power required on the vehicle is reduced, i.e. the gain factors are pre-loaded in the memory storage device 104 of the vehicle 1 such they do not have to be modelled every time the weighted moving average model is used. Thus, the modelled low-pass filter type weighted moving average model will be mounted on the target board like ESCM or HPCU etc. using embedded code implementation.

Figure 5:
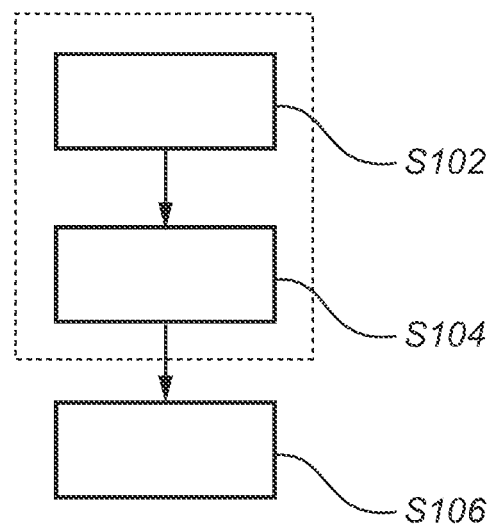
FIG. 5 is a flow-chart of method steps according to example embodiments of the invention.

FIG. 5 is a flow-chart of method steps according to example embodiments of the invention. In step S102, obtaining previous energy consumption values for a set of previous time instants, and a present drive pattern parameter value.

In step S104, estimating a present energy consumption based on a weighted moving average model fed with the energy consumption values. The weighted moving average model includes a modelled gain factor for at least a portion of the previous energy consumption values. The modelled gain factors are modelled based as a function of the drive pattern parameter. When estimating a present energy consumption based on a weighted moving average model, the gain factors are calculated using the present drive pattern parameter value obtained in step S102.

Optionally, in step S106, determining a remaining travel distance based on the predicted present energy consumption and a present state of charge of the battery.

A control unit may include a microprocessor, microcontroller, programmable digital signal processor or another programmable device. Thus, the control unit comprises electronic circuits and connections (not shown) as well as processing circuitry (not shown) such that the control unit can communicate with different parts of the truck such as the brakes, suspension, driveline, in particular an electrical engine, an electric machine, a clutch, and a gearbox in order to at least partly operate the truck. The control unit may comprise modules in either hardware or software, or partially in hardware or software and communicate using known transmission buses such as CAN-bus and/or wireless communication capabilities. The processing circuitry may be a general purpose processor or a specific processor. The control unit comprises a non-transitory memory for storing computer program code and data upon. Thus, the skilled addressee realizes that the control unit may be embodied by many different constructions.

The control functionality of the present disclosure may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a sequence the order of the steps may differ from what is depicted. Also two or more steps may be performed concurrently or with partial concurrency. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

It is to be understood that the present invention is not limited to the embodiments described above and illustrated in the drawings; rather, the skilled person will recognize that many changes and modifications may be made within the scope of the appended claims.

The invention claimed is:

1. A method for estimating a present energy consumption of an electrically propelled vehicle powered by a propulsion battery, the method comprising:
   obtaining previous energy consumption values for a set of previous time instants, and a present drive pattern parameter value; and
   estimating a present energy consumption based on a weighted moving average model fed with the energy consumption values, wherein,
   the weighted moving average model includes a modelled gain factor for each of at least a portion of the previous energy consumption values, where the modelled gain factors are modelled as non-linear functions of the drive pattern parameter.

2. The method according to claim 1, comprising obtaining a present battery parameter value, wherein estimating the present energy consumption is based on the weighted moving average model fed with the energy consumption values and the battery parameter value, wherein the moving average model includes a modelled gain factor for the battery parameter value.

3. The method according to claim 1, wherein the battery parameter is state of charge of the propulsion battery.

4. The method according to claim 1, wherein the weighted moving average model is a linear time invariant model.

5. The method according to claim 1, wherein the modelled gain factors are modelled using function approximators based on machine learning algorithms.

6. The method according to claim 1, wherein the modelled gain factors are predetermined offline using machine learning algorithms and are embedded in the moving average model loaded in an embedded system on the vehicle and operative during operation of the vehicle.

7. The method according to claim 1, comprising determining a remaining travel distance based on the predicted present energy consumption and a state of charge.

8. The method according to claim 1 wherein the gain factors are modelled based on prior driving pattern data comprising a set of state of charge values and a set of values of at least one further battery parameter, for a plurality of propulsion batteries obtained from actual driving pattern tests.

9. The method according to claim 1, wherein a number of previous time instants is selected from a range of one second back to 100 seconds back.

10. A non-transitory computer readable medium carrying a computer program comprising program code for performing the steps of claim 1 when the program code is run on a computer.

11. A system for estimating a present energy consumption of an electrically propelled vehicle powered by a propulsion battery, the system comprising:
    means for obtaining a drive pattern parameter value;
    a memory storage device for storing a representation of a weighted moving average model adapted to estimate the present energy consumption based on previous energy consumption values, the weighted moving average model includes a modelled gain factor for at least a portion of the previous energy consumption values, where the modelled gain factors are modelled as non-linear functions of the drive parameter, and
    processing circuitry for retrieving and executing the weighted moving average model to estimate the present energy consumption.

12. A vehicle comprising the system according to claim 11.

13. A control unit for estimating a present energy consumption of an electrically propelled vehicle powered by a propulsion battery the control unit being configured to:
    obtain previous energy consumption values for a set of previous time instants, and a present drive pattern parameter value; and
    estimate a present energy consumption based on a weighted moving average model fed with the energy consumption values, wherein,
    the weighted moving average model includes a modelled gain factor for each of at least a portion of the previous energy consumption values, where the modelled gain factors are non-linear functions of the drive pattern parameter.

* * * * *